(12) United States Patent
Kim et al.

(10) Patent No.: US 8,815,683 B2
(45) Date of Patent: Aug. 26, 2014

(54) NONVOLATILE MEMORY ELECTRONIC DEVICE INCLUDING NANOWIRE CHANNEL AND NANOPARTICLE-FLOATING GATE NODES AND A METHOD FOR FABRICATING THE SAME

(75) Inventors: Sangsig Kim, Seoul (KR); Chang Jun Yoon, Seoul (KR); Dong Young Jeong, Seoul (KR); Dong Hyuk Yeom, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 948 days.

(21) Appl. No.: 12/029,528

(22) Filed: Feb. 12, 2008

(65) Prior Publication Data
US 2010/0276667 A1 Nov. 4, 2010

(30) Foreign Application Priority Data

Feb. 23, 2007 (KR) .................. 10-2007-0018259
Feb. 23, 2007 (KR) .................. 10-2007-0018271

(51) Int. Cl.
*H01L 29/72* (2006.01)
(52) U.S. Cl.
USPC .............. 438/264; 257/24; 977/742; 977/762
(58) Field of Classification Search
USPC ....................... 438/264; 257/24; 977/742, 762
See application file for complete search history.

(56) References Cited

U.S. PATENT DOCUMENTS

| | | | |
|---|---|---|---|
| 5,923,046 A | 7/1999 | Tezuka et al. | |
| 6,258,650 B1 | 7/2001 | Sunouchi | |
| 6,657,278 B2 | 12/2003 | Lee | |
| 7,005,700 B2 | 2/2006 | Lee | |
| 2002/0153160 A1 | 10/2002 | Hofmann et al. | |
| 2004/0095837 A1 | 5/2004 | Choi et al. | |
| 2006/0003097 A1* | 1/2006 | Andres et al. | 427/212 |
| 2006/0252276 A1 | 11/2006 | Choi et al. | |
| 2007/0032091 A1 | 2/2007 | Heald et al. | |
| 2007/0064478 A1 | 3/2007 | Zhang | |
| 2007/0114593 A1 | 5/2007 | Radosavljevic et al. | |

FOREIGN PATENT DOCUMENTS

| | | |
|---|---|---|
| EP | 1341184 B1 | 9/2005 |
| EP | 1666873 A1 | 6/2006 |
| EP | 1763037 A1 | 3/2007 |

(Continued)

OTHER PUBLICATIONS

UK Examination Report for Patent Application No. GB0802436.6 which corresponds to the above-referenced application.

(Continued)

*Primary Examiner* — Edward Wojciechowicz
(74) *Attorney, Agent, or Firm* — Sughrue Mion, PLLC

(57) ABSTRACT

A nonvolatile memory electronic device including nanowire channel and nanoparticle-floating gate nodes, in which the nonvolatile memory electronic device, which comprises a semiconductor nanowire used as a charge transport channel and nanoparticles used as a charge trapping layer, is configured by allowing the nanoparticles to be adsorbed on a tunneling layer deposited on a surface of the semiconductor nanowire, whereby charge carriers moving through the nanowire are tunneled to the nanoparticles by a voltage applied to a gate, and then, the charge carriers are tunneled from the nanoparticles to the nanowire by the change of the voltage that has been applied to the gate, whereby the nonvolatile memory electronic device can be operated at a low voltage and increase the operation speed thereof.

27 Claims, 15 Drawing Sheets

(56) References Cited

FOREIGN PATENT DOCUMENTS

| | | | |
|---|---|---|---|
| JP | 2005-064452 | A | 3/2005 |
| JP | 2006-507660 | A | 3/2006 |
| JP | 2006-210910 | A | 8/2006 |
| KR | 10-2004-0047777 | A | 6/2004 |
| KR | 10-2005-0053626 | A | 6/2005 |
| KR | 10-2006-0061745 | A | 6/2006 |
| KR | 10-2006-0076861 | A | 7/2006 |
| KR | 10-0654140 | B1 | 11/2006 |
| KR | 10-2007-0011540 | A | 1/2007 |

OTHER PUBLICATIONS

German Examination Report for for Patent Application No. 10 2008 009 3653-33 which corresponds to the above-referenced application.
KIPO Office Action for Korean Patent Application No. 10-2007-0018259 which corresponds to the above-referenced application.
German Patent Office, Office Communication dated Dec. 6, 2013, in German Patent Application No. 102008009365.3.

* cited by examiner

[Fig.1]
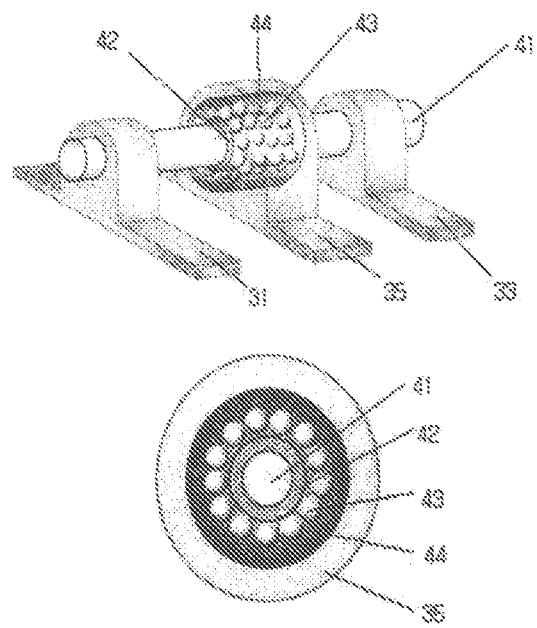
[Fig.2]
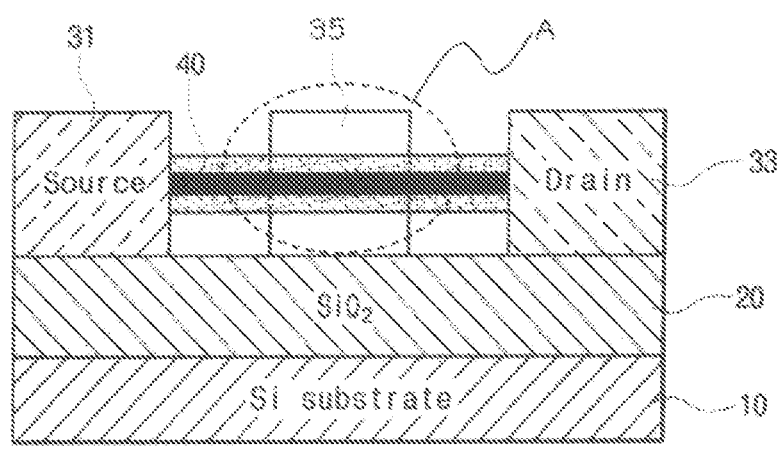

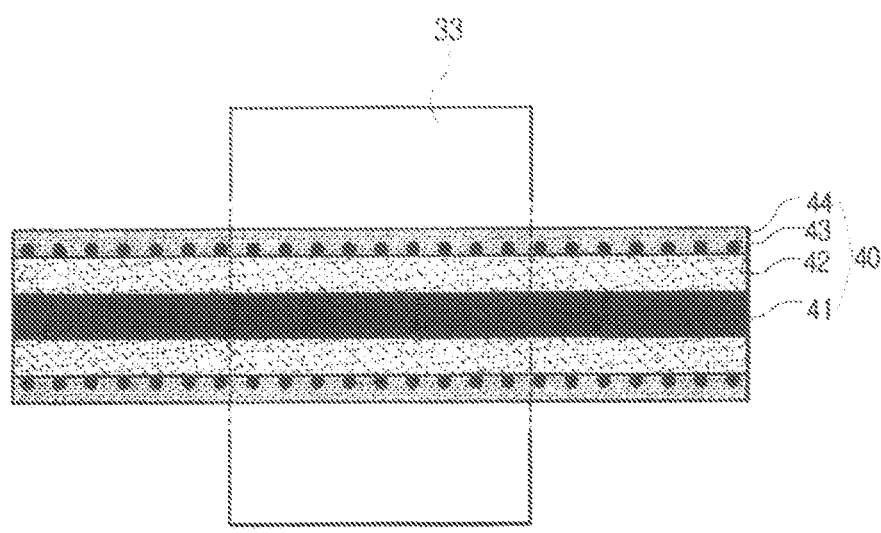
[Fig.3]

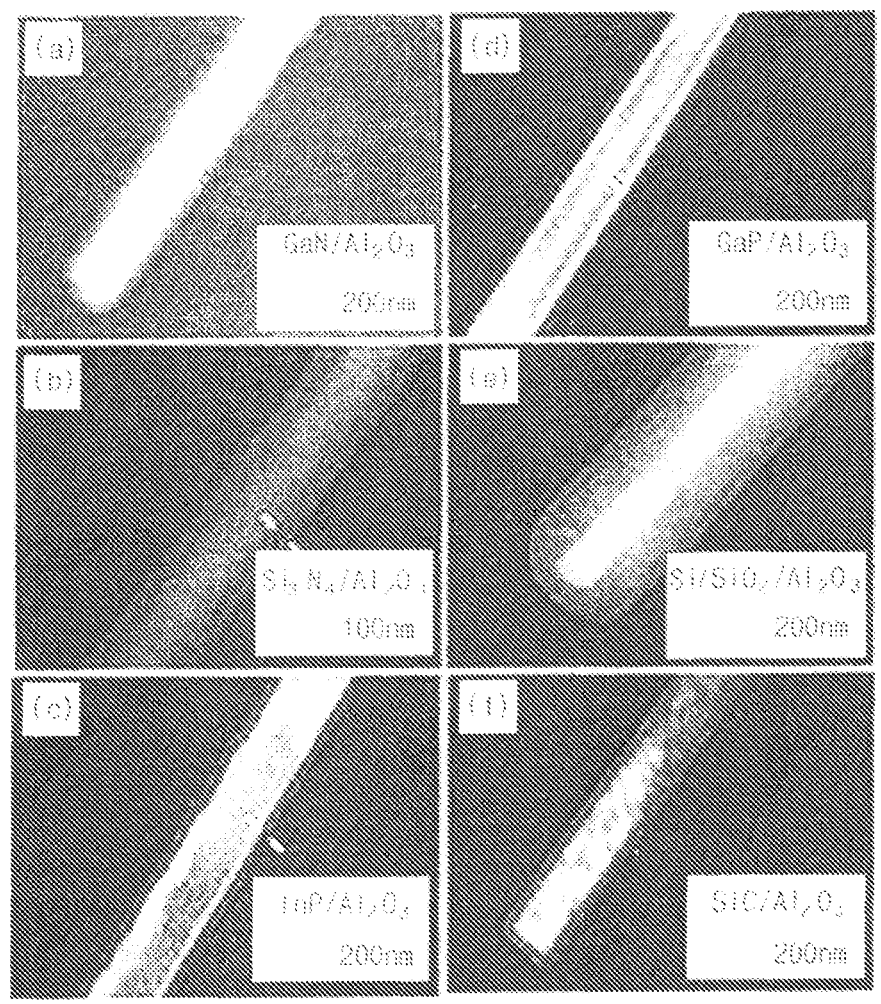
[Fig. 4]

[Fig.5]
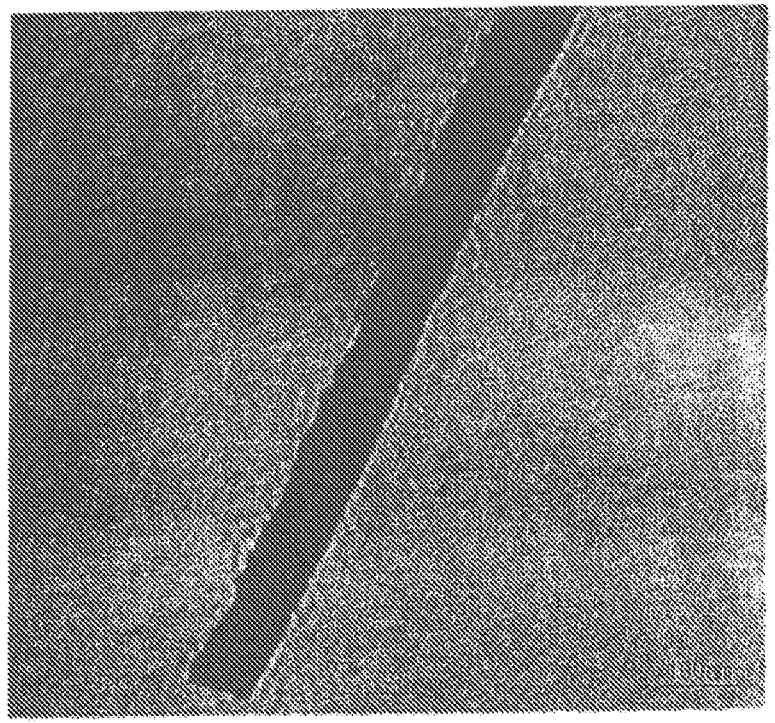
[Fig.6]
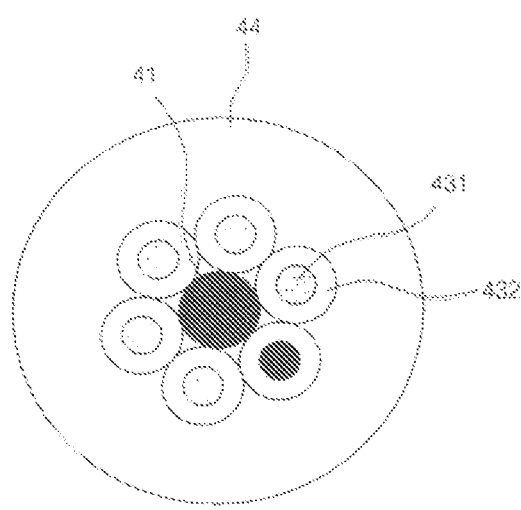

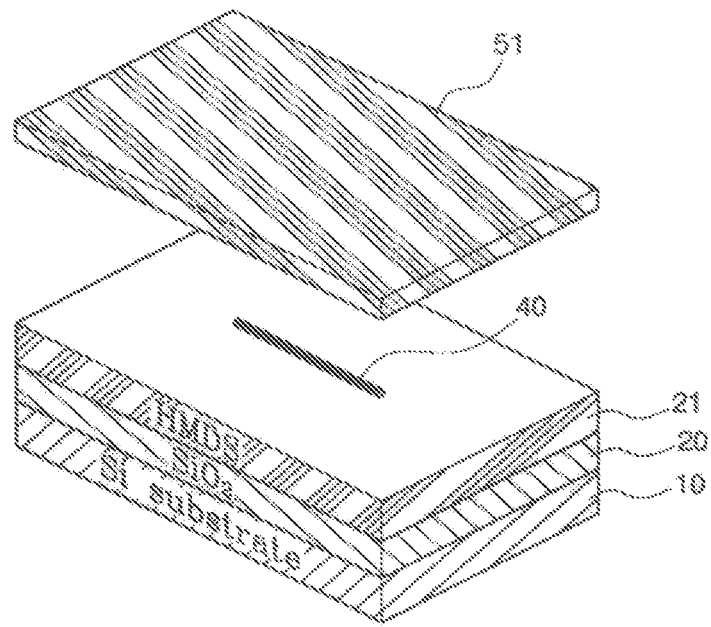
[Fig.7a]
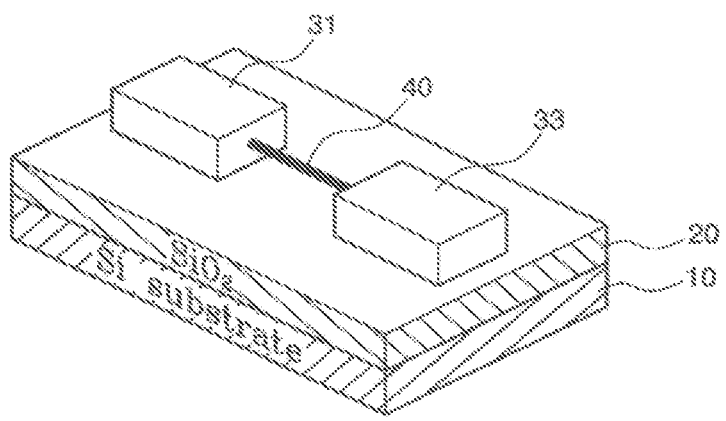
[Fig.7b]

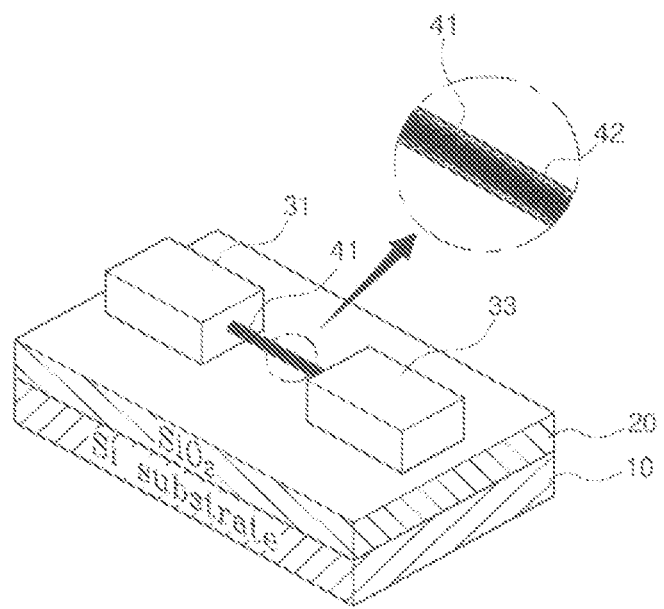
[Fig. 7c]
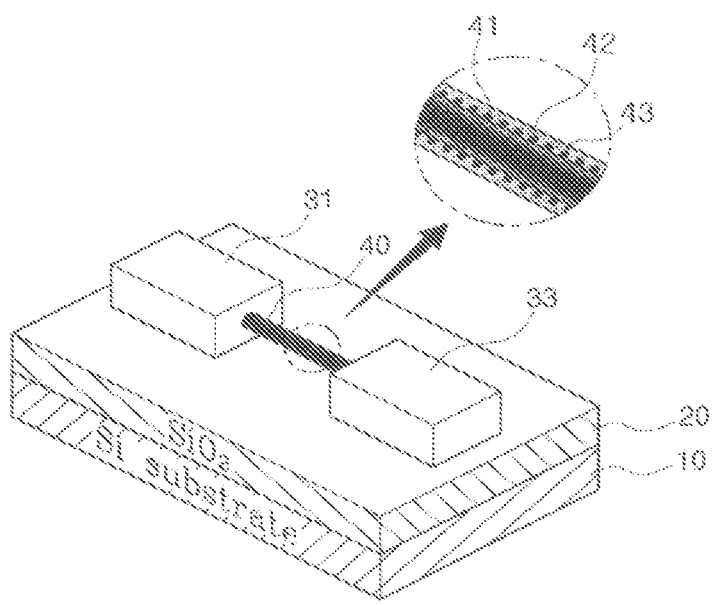
[Fig. 7d]

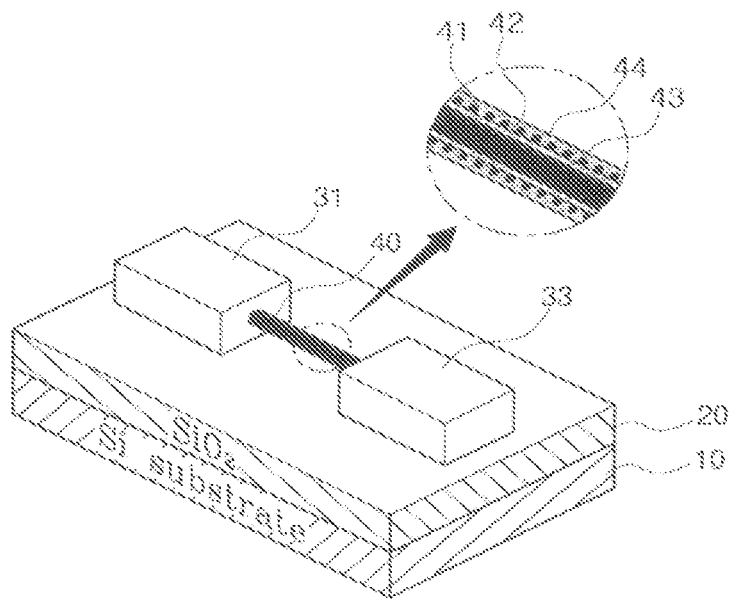
[Fig.7e]
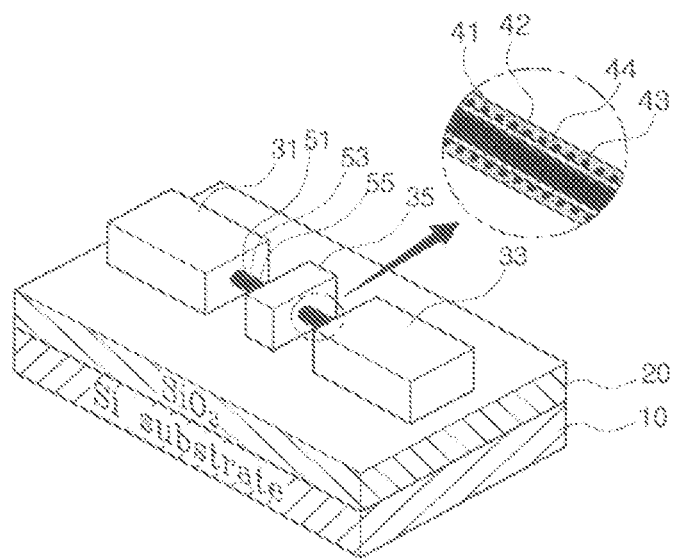
[Fig.7f]

[Fig.8a]
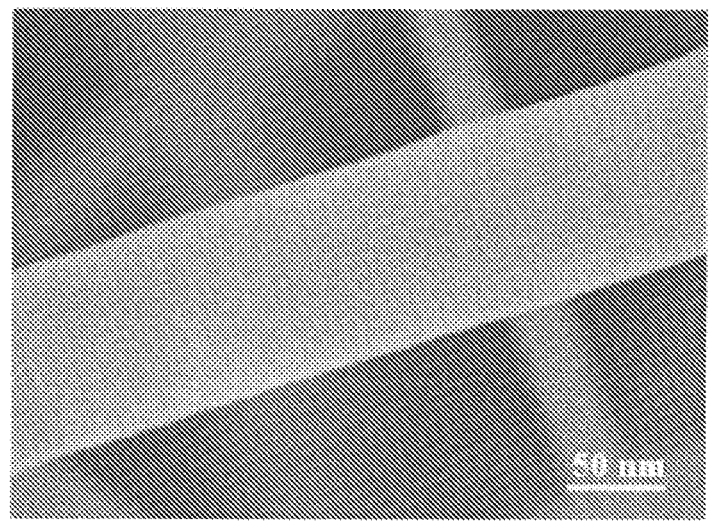
[Fig.8b]
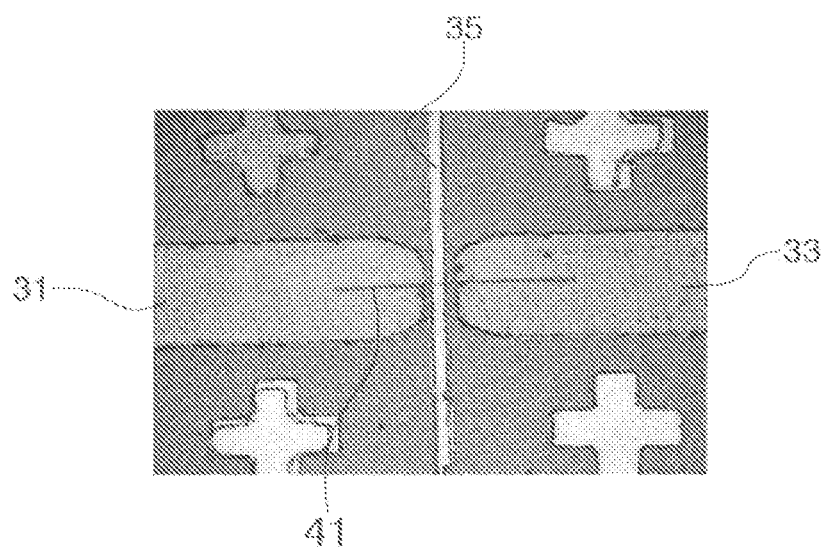

[Fig.9]
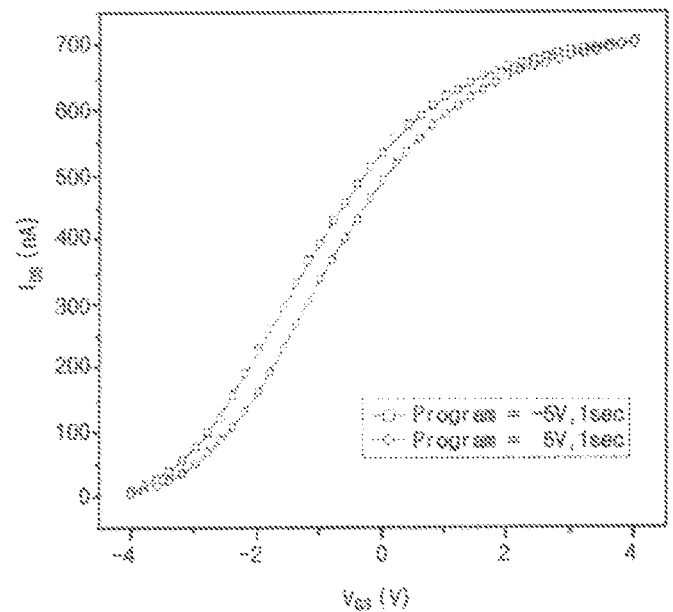
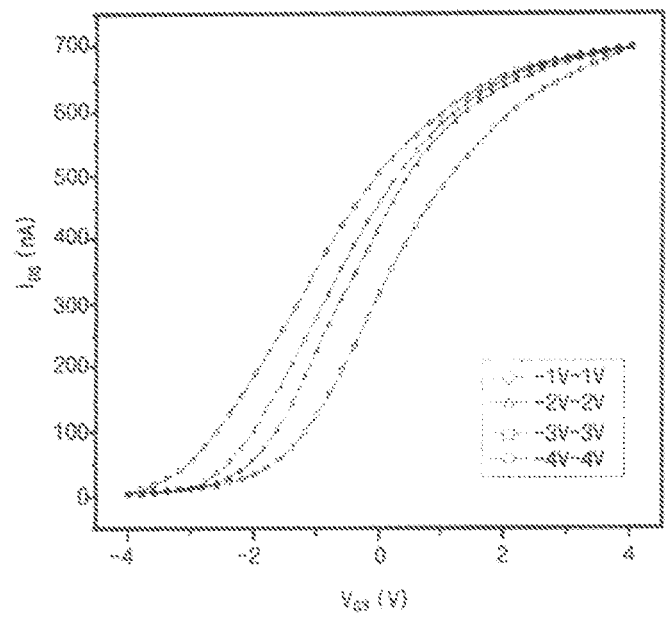

[Fig.10a]
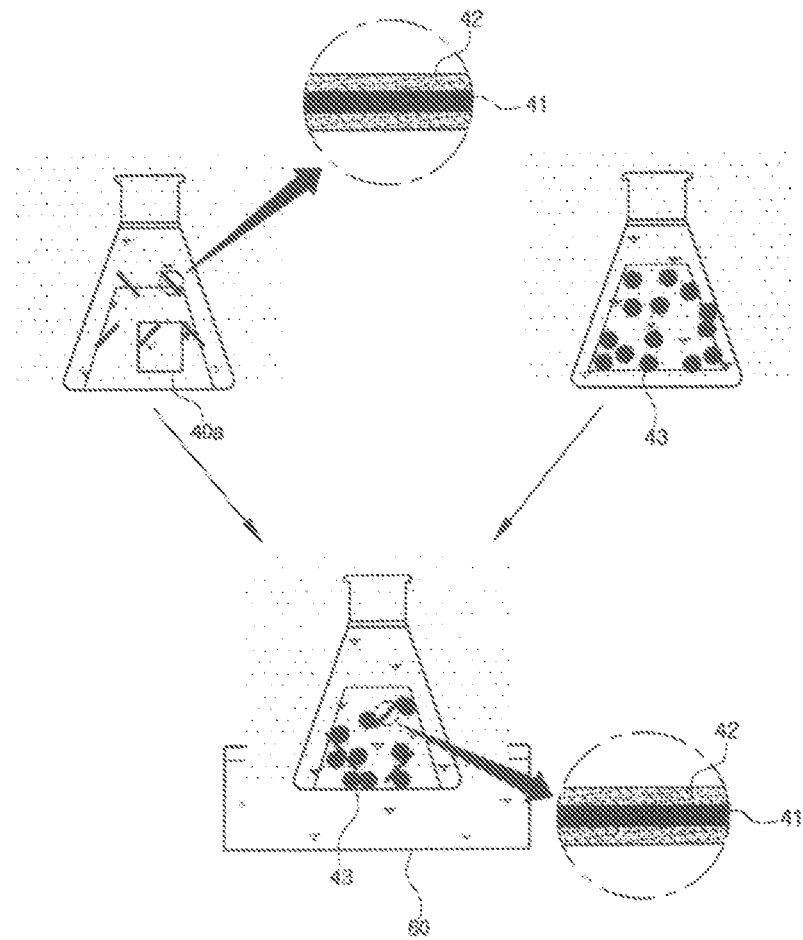
[Fig.10b]
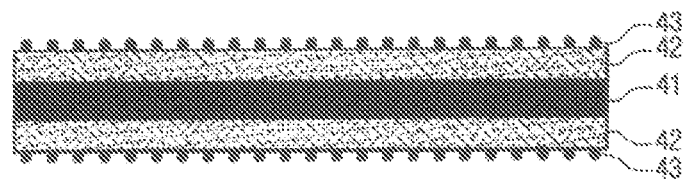

[Fig.10c]
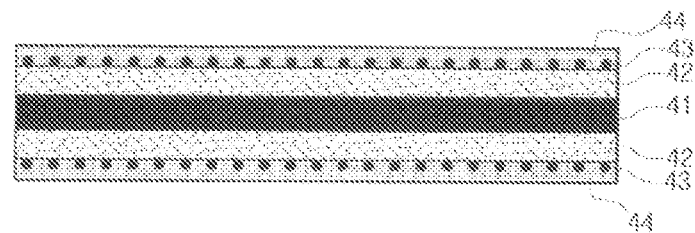
[Fig.10d]
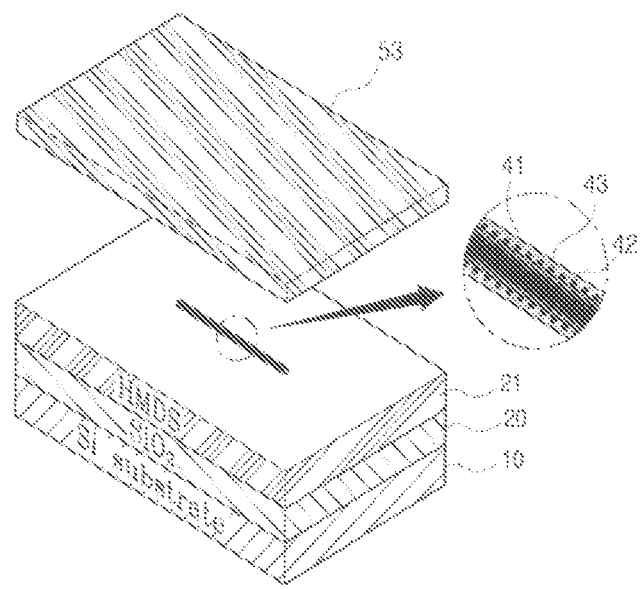

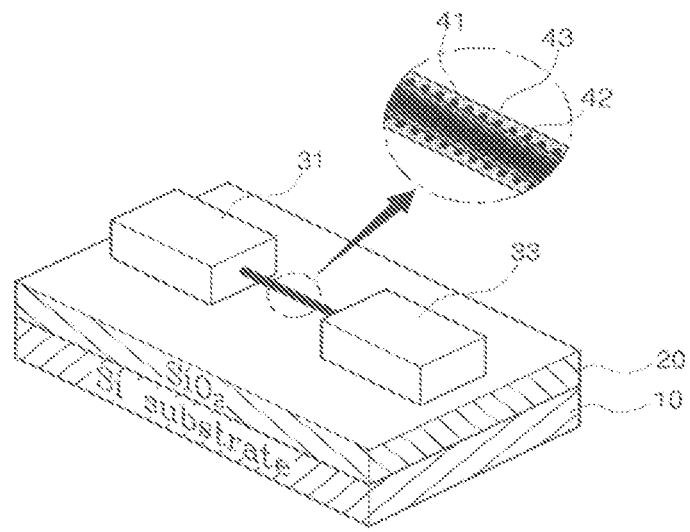
[Fig. 10e]
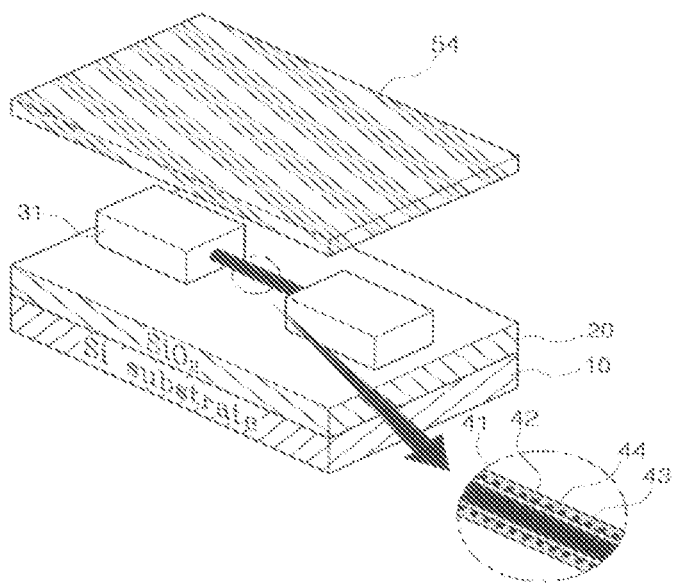
[Fig. 10f]

[Fig.10g]
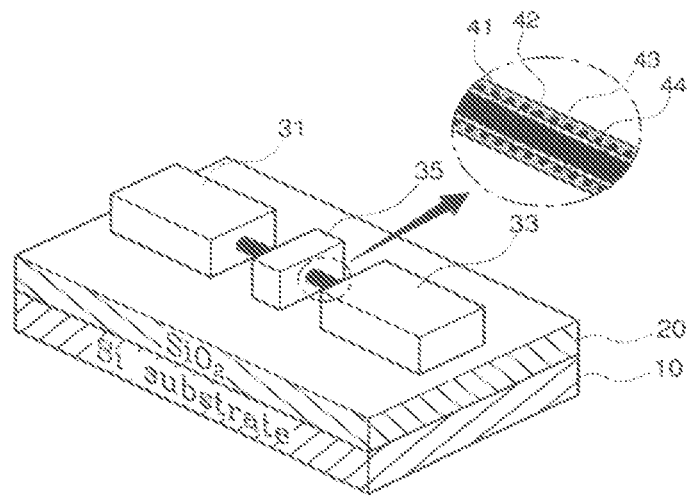
[Fig.11]
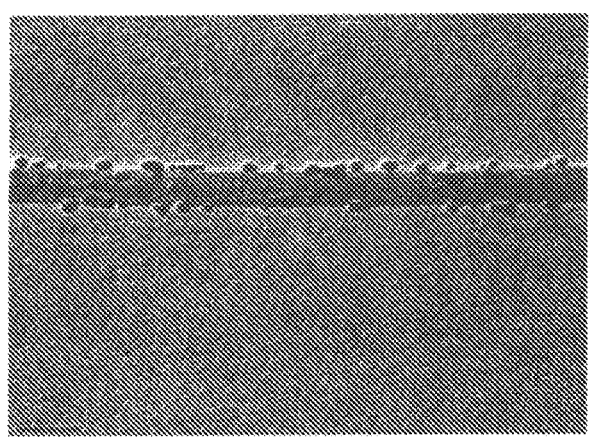

[Fig. 12]
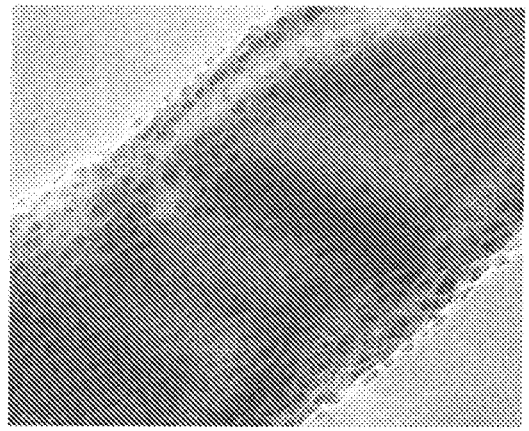
[Fig. 13]
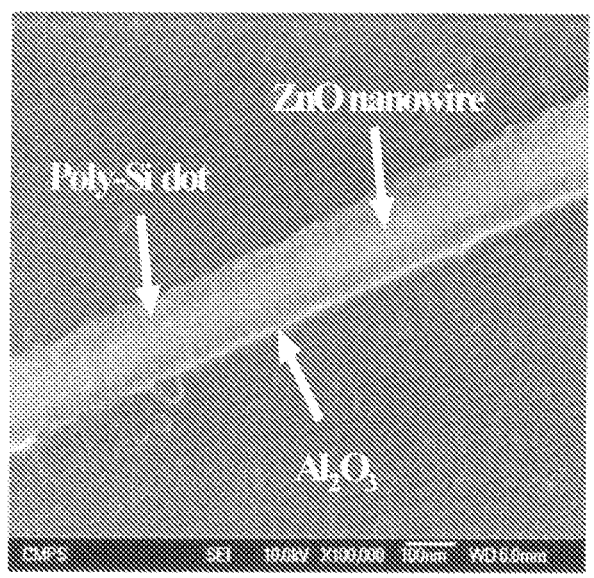

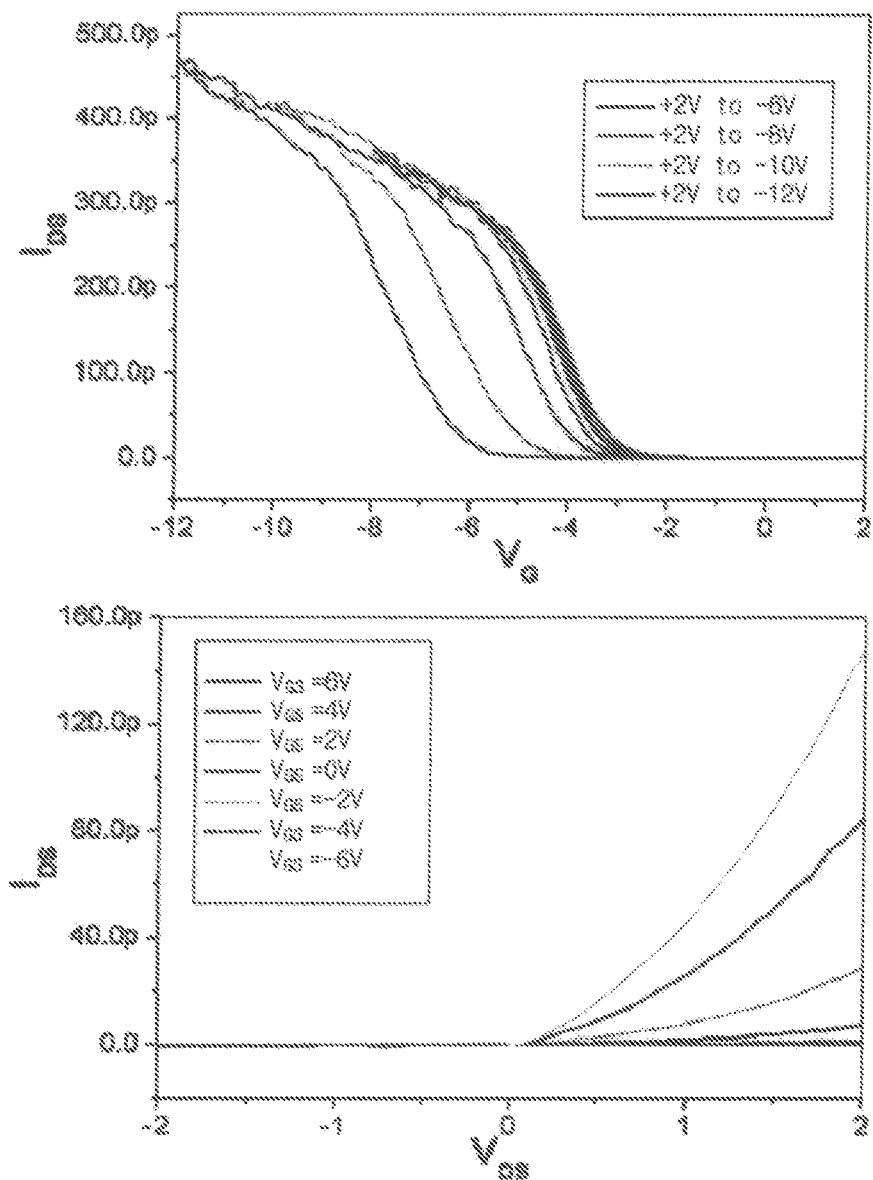
[Fig.14]

NONVOLATILE MEMORY ELECTRONIC DEVICE INCLUDING NANOWIRE CHANNEL AND NANOPARTICLE-FLOATING GATE NODES AND A METHOD FOR FABRICATING THE SAME

CROSS-REFERENCE TO RELATED APPLICATIONS

The benefit of priority is claimed to Republic of Korea Patent Applications No. 10-2007-0018271 and 10-2007-0018259, both of which were filed with the Korean Intellectual Property Office on Feb. 23, 2007, and both of which are incorporated by reference herein in their entireties.

BACKGROUND

1. Technical Field

The present discussion relates to a nonvolatile memory electronic device and a method for manufacturing the same, and more particularly, to a nonvolatile memory electronic device including nanowire channel and nanoparticles-floating gate nodes and a method for manufacturing the same, in which the nonvolatile memory electronic device, which includes a semiconductor nanowire used as a charge transport channel and nanoparticles used as a charge trapping layer, is configured by allowing the nanoparticles to be adsorbed on a tunneling layer deposited on a surface of the semiconductor nanowire, such that charge carriers moving through the nanowire are tunneled to the nanoparticles by a program voltage applied to a gate, and then, the charge carriers are tunneled from the nanoparticles into the nanowire by an erase voltage applied to the gate, such that the nonvolatile memory electronic device can be operated at a low voltage and at high operation speed.

2. Related Art

A memory market based on DRAMs, which have led economic and industrial developments in the semiconductor field, facilitates various memory products, such as digital cameras, portable phones, and the like, due to developments in the mobile products industry and IT technology.

In the memory market, a flash memory market, which has recently experienced explosive demand, is rapidly growing every year and is expected to occupy most of the memory market in the future. In order to support the performance of IT products that have been developed recently, it is urgently needed to provide inexpensive next generation nonvolatile memory technology that can provide excellent storage capability and operation speeds, for supplementing the disadvantages of existing flash memories.

It is considered that such a technology will become a growth factor of economic and industrial development in the future, and it will be difficult to satisfy the demand required by the world if a development rate of such a technology is slowed down. In the case of nanowire-based floating gate memory devices, in which problems of existing flash memory structure are supplemented, it is reckoned that nanowire-based floating gate memory devices can be commercialized in the near future by employing an existing fabrication process. Therefore, research on nanowire-based floating gate memory devices should be made as soon as possible.

Existing flash memory devices have various problems when the size of cells are decreased, since the existing flash memory devices require a high operating voltage. Therefore, there is a limit to the extent that the size of existing flash memory can be decreased. In the case of existing flash memory devices, the program/erase voltage is higher than 10 volts, which is very high as compared with a CMOS driving voltage.

This is because electrons are injected to a floating gate by channel-hot-electrons (CHE) process, and the injected electrons are extracted again by high-field-assisted tunneling (Fowler-Nordheim tunneling) which requires a higher operating voltage compared with a operating voltage (3~4 V) of direct tunneling.

Consequently, properties of a $SiO_2$ thin film currently used as a tunneling layer are very important since an ultra-thin oxide film should be formed to enable the direct tunneling and reduce a program/erase time.

However, since many defects of the $SiO_2$ thin film forming leakage paths make charge carriers difficult to be trapped in the floating gate nodes. In order to solve such a problem, it is on the rise as an important problem to eliminate defects of a tunneling layer.

In the meantime, although existing flash memory devices draws an attention as a mass storage media since the existing flash memory devices are excellent in degree of integration as compared with DRAM, it is imperative to develop an inexpensive next generation nonvolatile memory having superior information storage capability and fast operating speed even at a low voltage in order to support the performance of an IT apparatus that is developed very fast.

Furthermore, the size of memory cells should be reduced to increase the capacity of the flash memory devices, the thickness of a tunneling layer should be minimized in order to reduce the size of the cells, and the thinner tunneling layer enables lower program/erase voltage.

However, the existing flash memory devices have a program/erase voltage of about 9 to 12 V that is very higher than CMOS and DRAM driving volts. If several program/erase processes are performed at such a high voltage, a thin tunneling layer will be broken, creating a leakage path for charge carriers in the floating gate layer and causing the tunneling layer to lose its function.

Furthermore, a charge trapping layer of the existing flash memory devices is formed of a continuous thin film. However, when the tunneling layer is partially broken, a large leakage current is generated while charge carriers in the charge trapping layer flow into the channels through the damaged tunneling layer.

The existing devices further have the disadvantage of exhibiting poor endurance since the tunneling layer is considerably damaged as the program/erase processes are performed many times.

In order to prevent such a problem, thicker tunneling and insulating layers are required. However, there is a problem that the thicker tunneling and insulating layers deteriorate the degree of integration of a device and require a high program/erase voltage.

SUMMARY

The present device and method are conceived to solve the aforementioned problems of existing memory devices. An object is to provide a memory electronic device including nanowire channel and nanoparticle-floating gate nodes and a method for manufacturing the same, inter alia. The memory electronic device including nanowire channel and nanoparticle-floating gate nodes is configured by forming nanoparticles on a surface of a tunneling layer formed to cover a nanowire such that the nanoparticles cover the nanowire and the tunneling layer. At this time, a degree of integration is improved by reducing channels used in transporting charge carriers using a nanowire, and a property of the channels is improved using a nanowire with excellent charge mobility. In addition, nanoparticles used as a charge trapping layer enable the device to be operated even at a low voltage, and thus, the thickness of the tunneling and insulating layers is reduced, thereby improving a degree of integration of the device.

Another object is to provide a memory electronic device including nanowire channel and nanoparticles-floating gate nodes and a method for manufacturing the same, wherein a gate structure used in a nonvolatile memory device is changed from an existing one-dimensional planar structure shape to a gate structure shape, such as top, omega and cylinder shapes, so that on/off property, subthreshold swing effect and mobility of charge carriers in the device are maximized according to the change of the gate structure, thereby providing a faster device operating speed and a low operating voltage. In addition, the method is simpler and less expensive than an existing top-down type fabrication process.

According to at least one aspect, there is provided a nanowire-nanoparticle nonvolatile memory electronic device, including source and drain electrodes formed on a substrate, a semiconductor nanowire composite connected to the source and drain electrodes in a state where the semiconductor nanowire composite is floated from the substrate or adsorbed thereon, and a gate electrode formed on the substrate between the source and drain electrodes to cover the nanowire composite.

In the above-referenced aspect, the semiconductor nanowire composite may include a semiconductor nanowire, a tunneling layer formed to cover the semiconductor nanowire, a charge trapping layer having nanoparticles adsorbed on a surface of the tunneling layer and formed to cover the tunneling layer, and an insulating layer formed to cover the charge trapping layer.

In addition, in the above aspect, the semiconductor nanowire composite may be a carbon nanotube or organic tube as well as the semiconductor nanowire.

The semiconductor nanowire may be formed of any one or more selected from the group consisting of Si, Ge, GaN, BN, InP, GaAs, GaP, $Si_3N_4$, $SiO_2$, SiC, ZnO, $Ga_2O_3$, or mixtures thereof.

The nanoparticle may include any one component selected from HgTe, HgSe, HgS, CdTe, CdSe, CdS, ZnTe, ZnSe, ZnS, ZnO, PbTe, PbSe, PbS, Ag, Au, Pt, Ti, Co, W, Ni and Fe.

The nanoparticle may be configured in a core-shell structure comprising a core formed of any one component selected from HgTe, HgSe, HgS, CdTe, CdSe, CdS, ZnTe, ZnSe, ZnS, ZnO, PbTe, PbSe, PbS, Ag, Au, Pt, Ti, Co, W, Ni and Fe, and a shell formed on the core and consisting of $SiO_2$, $TiO_2$ or a semiconductor nanoparticle having a higher energy gap than the core. The tunneling layer and the insulating layer may be formed of any one of $Al_2O_3$, $HfO_2$, $SiO_2$, MgO, $ZrO_2$, BaO, $SrTiO_3$, $La_2O_3$, $HfSiO_4$, $ZrSiO_4$, CaO, $LaAlO_3$, SrO, CaO and an organic insulating material.

In accordance with another aspect, there is provided a method for fabricating a nonvolatile memory electronic device nanowire channel and nanoparticles-floating gate nodes, including the steps of: preparing a semiconductor nanowire composite; forming a gate electrode in a central part of a nanowire on the semiconductor nanowire composite by a photolithography or electron beam lithography method; applying a sample of the nanowire composite/gate electrode formed nanowire composite to a SiO2 capped silicon, semiconductor, glass or plastic substrate; and forming source and drain electrodes on both ends of the nanowire on the silicon, semiconductor, glass or plastic substrate by a photolithography or electron beam lithography method.

The step of preparing a semiconductor nanowire composite may include the steps of: coating a semiconductor nanowire with a tunneling layer by any of an atomic layer deposition method, a sputtering method or a chemical vapor deposition (CVD) method; adsorbing nanoparticles on the tunneling layer, the nanoparticles being formed into a charge trapping layer; and coating the nanoparticles with an insulating layer by any of an atomic layer deposition method, a sputtering method or a CVD method.

In addition, the step of preparing a semiconductor nanowire composite may include the steps of adsorbing nanoparticles of a core-shell structure on the nanowire; and coating the nanoparticles of the core-shell structure with an insulating layer by any one or more of an atomic layer deposition method, a sputtering method or a CVD method.

In accordance with another aspect, there is provided a fabrication method of a nowire-nanoparticle nonvolatile memory electronic device including nanowire channel and nanoparticles-floating gate nodes, including the steps of: applying a hexamethyldisilazane (HMDS) layer to any of a semiconductor, glass or plastic (or any combination thereof) substrate and forming a semiconductor nanowire on the HMDS layer; forming source and drain electrodes on both ends of the semiconductor nanowire on the HDMS layer having the semiconductor nanowire formed thereon; forming a tunneling layer to cover the semiconductor nanowire by any of an atomic layer deposition method, a sputtering method or a CVD method; forming a charge trapping layer to cover the tunneling layer by forming nanoparticles on a surface of the tunneling; forming an insulating layer to cover the charge trapping layer by any of an atomic layer deposition method, a sputtering method or a CVD method; and forming a gate electrode on the insulating layer between the source and drain electrodes.

The step of forming a semiconductor nanowire may include the step of forming a semiconductor nanowire the step of growing nanowire on a substrate by a thermal evaporation method.

The step of forming a semiconductor nanowire may include the step of etching a semiconductor substrate by an etching method.

The step of forming a charge trapping layer may include the steps of coating a surface of the tunneling layer with a metal nanofilm by a thermal evaporation method, and forming metal nanoparticles by heating the metal nanofilm using a rapid thermal annealer (RTA).

The step of coating a surface of the tunneling layer with a metal nanofilm may be performed with a thickness between 2 to 10 nm.

The step of forming metal nanoparticles may be performed by heating the metal nanofilm at a temperature of 250 to 1100° C. for 5 to 30 seconds.

In accordance with another aspect, there is provided a fabrication method of a nowire-nanoparticle nonvolatile memory electronic device including nanowire channel and nanoparticles-floating gate nodes, including the steps of: coating a surface of a semiconductor nanowire grown on a substrate with a tunneling layer by any of an atomic layer deposition method, a sputtering method or a CVD method; adsorbing nanoparticles on the tunneling layer formed on the surface of the semiconductor nanowire, the nanoparticles being formed into a charge trapping layer; coating the nanoparticles formed into the charge trapping layer with an insulating layer by any of an atomic layer deposition method, a sputtering method or a CVD method; applying an HMDS layer to any of a semiconductor, glass or plastic substrate, and forming the semiconductor nanowire having the tunneling layer, the charge trapping layer and the insulating layer sequentially formed on the surface thereof on the HMDS layer; forming source and drain electrodes on both ends of the semiconductor nanowire on the HMDS layer having the semiconductor nanowire formed thereon; and forming a gate electrode on the insulating layer between the source and drain electrodes.

The step of growing a semiconductor nanowire may be performed by growing a semiconductor nanowire on a substrate formed of a Si or $Al_2O_3$ material.

The step of adsorbing nanoparticle may include the steps of: dipping the substrate to which the grown nanowire is attached into an aqueous dispersion, and dispersing the nanowire using ultrasonic waves; mixing the aqueous nanowire dispersion with an aqueous dispersion containing nanoparticles; and adsorbing the nanoparticles on the nanowire using ultrasonic waves.

The aqueous dispersion may be any one selected from distilled water, ethanol, methanol and acetone.

The step of adsorbing nanoparticle may be performed by mixing the semiconductor nanowire with a solution containing nanoparticles.

The step of depositing nanoparticle may be performed by depositing a poly-Si layer on the semiconductor nanowire by an low pressure chemical vapor deposition method and then etching the poly-Si layer by a wet etching method to form Si nanoparticles.

The step of forming source and drain electrodes may include the steps of: applying a first photoresist and forming a plurality of first space portions by a photolithography method; and laminating a metal layer in the first space portions and on the first photoresist and removing the first photoresist and the HMDS layer to form the source and drain electrodes on both the ends of the semiconductor nanowire.

The steps of forming a tunneling layer and an insulating layer may be performed by using any one selected from $Al_2O_3$, $HfO_2$ and $SiO_2$ by an atomic layer deposition method.

In the steps of forming a tunneling layer and an insulating layer, TMA and $H_2O$ may be used as a precursor when the tunneling layer and the insulating layer are formed of $Al_2O_3$.

The tunneling layer may be formed to have a thickness between 5 nm and 30 nm. The insulating layer may be formed to have a thickness between 10 nm and 60 nm. The step of forming a semiconductor nanowire may include the step of forming a carbon nanotube (CNT) or an organic tube as well as the semiconductor nanowire.

The step of forming a gate electrode may be include the steps of: applying a second photoresist to a substrate having the insulating layer and the source and drain electrodes formed thereon, and forming a second space portion between the source and drain electrodes by a photolithography method; and laminating a metal layer in the second space portion and on the second photoresist and removing the second photoresist to form a gate electrode.

BRIEF DESCRIPTION OF THE DRAWINGS

FIG. 1 is a view schematically illustrating the concept of a nonvolatile memory electronic device including nanowire channel and nanoparticles-floating gate nodes according to the present invention;

FIG. 2 is a cross-sectional view illustrating a nonvolatile memory electronic device including nanowire channel and nanoparticles-floating gate nodes according to a preferred embodiment of the present invention;

FIG. 3 is an exploded cross-sectional view illustrating a portion "A" of FIG. 2;

FIG. 4 shows transmission electron microscope (TEM) images of cylinder-shaped $Al_2O_3$ oxide films with which various nanowires according to embodiments of the present invention are coated;

FIG. 5 shows a TEM image of a structure of HgTe nanoparticles coated insulating layer formed on a ZnO nanowire according to an embodiment of the present invention;

FIG. 6 is a cross-sectional view illustrating a semiconductor nanowire composite using nanoparticles of a core-shell structure according to the embodiment of the present invention;

FIGS. 7a to 7g are flowcharts illustrating a process of fabricating a nonvolatile memory electronic device including nanowire channel and nanoparticles-floating gate nodes according to a second embodiment of the present invention;

FIG. 8a shows a TEM image of a nanowire-insulating material-nanoparticle structure according to the second embodiment of the present invention comprising a nanowire having an insulating layer used as a charge channel layer formed thereon and nanoparticles formed on the nanowire to be used as a charge trapping layer;

FIG. 8b shows a plan photograph of a nonvolatile memory electronic device including nanowire channel and nanoparticles-floating gate nodes fabricated according to the second embodiment of the present invention;

FIG. 9 is a graph illustrating electrical properties of a nonvolatile memory electronic device including nanowire channel and nanoparticles-floating gate nodes fabricated according to the second embodiment of the present invention;

FIGS. 10a to 10g are flowcharts illustrating a process of fabricating a nonvolatile memory electronic device including nanowire channel and nanoparticles-floating gate nodes according to a third embodiment of the present invention;

FIG. 11 shows a TEM image of a Si nanowire on which Au nanoparticles are coated by an ultrasonic treatment process according to the third embodiment of the present invention;

FIG. 12 shows a TEM image of a ZnO nanowire on which CdTe nanoparticles are coated using a mixed solution according to the third embodiment of the present invention;

FIG. 13 is a scanning electron microscopic (SEM) photograph showing that a poly-Si layer is deposited on a ZnO nanowire wherein the poly-Si layer is prepared by etching a silicon layer using chemical etching process according to the third embodiment of the present invention; and FIG. 14 is a graph illustrating electrical properties of a nonvolatile memory electronic device including nanowire channel and nanoparticles-floating gate nodes fabricated according to the third embodiment of the present invention.

DETAILED DESCRIPTION

Hereinafter, specific configuration and operation of the present invention will be described in detail with reference to the accompanying drawings. FIG. 1 is a schematic view illustrating the concept of a nonvolatile memory electronic device including nanowire channel and nanoparticles-floating gate nodes according to the present invention, FIG. 2 is a cross-sectional view illustrating a nonvolatile memory electronic device including nanowire channel and nanoparticles-floating gate nodes according to a preferred embodiment of the present invention, and FIG. 3 is an exploded cross-sectional view illustrating a portion "A" of FIG. 2

Referring to FIGS. 1 to 3, a nonvolatile memory electronic device including nanowire channel and nanoparticles-floating gate nodes according to the present invention comprises source and drain electrodes 31 and 33 formed on a semiconductor, glass or plastic substrate 10, a semiconductor nanowire composite 40 connected to the source and drain electrodes 31 and 33 in a state where the semiconductor nanowire composite is floated from the semiconductor, glass or plastic substrate 10 and adsorbed thereon, and a gate electrode 35 formed on the silicon substrate 10 between the source and drain electrodes 31 and 33 to cover the nanowire composite 40.

Here, the nanowire composite 40 includes a semiconductor nanowire 41, a tunneling layer 42 formed to cover the semiconductor nanowire 41, a charge trapping layer 43 of nanoparticles adsorbed on a surface of the tunneling layer 42 and formed to cover the tunneling layer, and an insulating layer 44 formed to cover the charge trapping layer 43.

Hereinafter, a fabrication method of a nonvolatile memory electronic device including nanowire channel and nanoparticles-floating gate nodes according to the present invention will be described in detail referring to embodiments.

First Embodiment

A fabrication method of a nonvolatile memory electronic device including nanowire channel and nanoparticles-floating gate nodes according to a first embodiment of the present invention comprises steps of preparing a semiconductor nanowire composite, forming a gate electrode in a central part of a semiconductor nanowire composite by a photolithography or electron beam lithography method, applying a sample of the nanowire composite/gate electrode formed nanowire composite to a $SiO_2$ capped silicon, semiconductor, glass or plastic substrate, and forming source and drain electrodes on both ends of the nanowire on the substrate by a photolithography or electron beam lithography method.

Here, the step of preparing a semiconductor nanowire composite includes steps of coating a semiconductor nanowire with a tunneling layer of an insulating material by an atomic layer deposition method, of an organic insulating material, and of an insulating layer by a sputtering method or a chemical vapor deposition (CVD) method, and steps of adsorbing nanoparticles on the tunneling layer as a charge trapping layer, and steps of coating the nanoparticles with an insulating material by an atomic layer deposition method, an organic insulating material, and an insulating layer by a sputtering method or a CVD method.

The semiconductor nanowire is one of ZnO, GaN, SiC, $SnO_2$, GaP, BN, InP, $Si_3N_4$, GaAs and Si and semiconductor nanowires, or mixtures thereof. In addition, the tunneling layer is formed of $Al_2O_3$, a precursor of Al and O is trimethylaluminum (TMA) and $H_2O$, and the tunneling layer is uniformly deposited with a thickness of about 1 to 10 nm, so that the tunneling layer can be formed on the semiconductor nanowire to have a predetermined thickness in an omega or cylinder shape.

The tunneling layer is formed of $SiO_2$ and uniformly deposited with a thickness of about 1 to 10 nm, so that the tunneling layer can be formed on the semiconductor nanowire to have a predetermined thickness in an omega or cylinder shape. The tunneling layer is formed of an organic insulating layer and uniformly deposited with a thickness of about 1 to 10 nm, so that the tunneling layer can be formed on the semiconductor nanowire to have a predetermined thickness in an omega or cylinder shape.

Furthermore, the charge trapping layer formed of nanoparticles consists of one of HgTe, HgSe, HgS, CdTe, CdSe, CdS, ZnTe, ZnSe, ZnS, ZnO, PbTe, PbSe, PbS, Au, Ag, Pt, Ti, Co, W, Ni and Fe, or one of Si, Au, Pt, Co, W, Ni and Fe formed using a CVD apparatus, sputter or evaporator.

A nonvolatile memory electronic device including nanowire channel and nanoparticles-floating gate nodes formed by the aforementioned fabrication method will be described in detail as follows.

A tunneling layer is deposited with an insulating material by an atomic layer deposition method, with an organic insulating material using an organic material, and with an insulating layer by a sputtering or CVD method on the semiconductor nanowires with a predetermined thickness after preparing the semiconductor nanowires of ZnO, GaN, Si, GaAS, synthesized by a thermal CVD method or formed by etching a semiconductor substrate, thereby forming tunneling layer in a top shape in which only an upper portion of the semiconductor nanowire is deposited, in an omega shape in which most of the nanowire is uniformly deposited, or in a cylinder shape in which the entire nanowire is uniformly deposited. FIG. 4 of the accompanying drawings shows TEM images of $Al_2O_3$ oxide films formed on a variety of semiconductor nanowires prepared by the aforementioned method.

Then, a charge trapping layer is formed by drying the semiconductor nanowire composite after adsorbing the nanoparticles onto the periphery of the nanowire by dipping the tunneling layer coated semiconductor nanowire into a solvent for several seconds to several minutes, where a semiconductor nanoparticles such as HgTe, CdTe, or metal nanoparticles such as Au, Co, Ni, prepared by a wet chemical method, are dispersed. FIG. 5 is a TEM image showing that HgTe nanoparticles are coated on the surface of a ZnO nanowire formed by the aforementioned method.

After deposition of charge trapping layer on the semiconductor nanowire coated with tunneling layer, an insulating layer with a thickness of 10 to 60 nm is formed with organic insulating material or insulating materials using an atomic layer deposition and sputtering method. Then, the gate electrode is formed on the central part of the semiconductor nanowire composite using a photolithography method or an electron beam lithography method.

After dispersing semiconductor nanowire composite/gate electrode formed nanowire composite formed by the aforementioned method into a solvent such as ethanol or methanol, it is dispersed on a $SiO_2$ capped silicon substrate, an insulating layer capped semiconductor substrate, a glass substrate, or a plastic substrate (not shown) by a dropping method, a spin coating method, an Langmuir-Blodget (LB) method, or the like. Then, the nanowire-nanoparticle nonvolatile memory electronic device is manufactured by forming the source and drain electrodes on both the ends of the semiconductor nanowire on the silicon substrate using a photolithography method or an electron beam lithography method.

FIG. 6 is a cross-sectional view illustrating a nonvolatile memory electronic device including nanowire channel and nanoparticles-floating gate nodes using nanoparticles of a core-shell structure. As illustrated in FIG. 6, a nonvolatile memory electronic device having a core-shell structure according to the present invention is configured in a core-shell structure comprising a core 431 formed of nanoparticles consisting of one of HgTe, HgSe, HgS, CdTe, CdSe, CdS, ZnTe, ZnSe, ZnS, ZnO, PbTe, PbSe, PbS, Au, Ag, Pt, Ti, Co, W, Ni and Fe prepared by a wet chemical method, and a shell 432 formed of $SiO_2$, $TiO_2$ or semiconductor nanoparticles having a higher energy gap than the core 431.

Such a core-shell structure enables the nonvolatile memory electronic device to be fabricated by performing a subsequent process as in the first embodiment after directly adsorbing nanoparticles of a core-shell structure such as HgTe/CdTe, Au/SiO$_2$, or the like onto the semiconductor nanowire without forming a tunneling layer on the periphery of the semiconductor nanowire.

Second Embodiment

Referring to FIGS. 7a to 7g, a fabrication process of a nonvolatile memory electronic device including nanowire channel and nanoparticles-floating gate nodes according to a second embodiment of the present invention will be described. First, referring to FIG. 7a, semiconductor nanowires 41 are dispersed on the hexamethyldisilazane (HMDS) film 21, deposited on a silicon, semiconductor, glass, or plastic substrate 10 not only to increase adhesive force between the photoresist layer and substrate but also to serve as a sacrificial layer for the semiconductor nanowire 41 to be floated from the substrate, then the first photoresist layer 51 is spin-coated onto the semiconductor nanowire-dispersed HMDS film. Resist patterns in the range from several μm to several tens of nm for the formation of electrodes are made after exposure and development processes. That is, a first space portion (not shown,) in which source and drain electrodes to be described later are formed, is formed using a photolithography method. In the meantime, SiO$_2$ or other insulating layers 20 can be formed between the silicon, semiconductor, glass, or plastic substrate 10 and the HMDS film 21.

Here, the semiconductor nanowire 41 is formed on the HMDS film 21, and, if necessary, a carbon nanotube or an organic tube as well as the semiconductor nanowire may be formed on the HMDS film 21. The semiconductor nanowire 41 is preferably selected from one of components of Si, Ge, GaN, BN, InP, GaAs, GaP, Si$_3$N$_4$, SiO$_2$, SiC, ZnO and Ga$_2$O$_3$. The semiconductor nanowire 41 is synthesized by a thermal CVD method or formed by etching a semiconductor substrate. This semiconductor nanowire 41 is dispersed into an aqueous solution, and then sprayed onto the HMDS film 21.

Subsequently, after deposition of a metal layer in the first space portion and on the first photoresist 51, the first photoresist 51 and the HMDS film 21 are removed. Accordingly, a source electrode 31 and a drain electrode 33 are formed on both ends of the semiconductor nanowire 41 as illustrated in FIG. 7b. The metal layer of the source and drain electrodes 31 and 33 can be formed by deposition of titanium (Ti) and gold (Au) sequentially. Thereafter, a semiconductor nanowire composite 40 is formed as illustrated in FIGS. 7c to 7e, which will be described in detail as follows.

As illustrated in FIG. 7c, a tunneling layer 42 is formed to cover the semiconductor nanowire 41. The tunneling layer 42 is formed of any one of Al$_2$O$_3$, HfO$_2$, SiO$_2$ and an organic insulating material by an atomic layer deposition method, a CVD method, a sputtering method, or the like. In such a state, the semiconductor nanowire 41 having the tunneling layer 42 deposited on the outer surface thereof can be formed in an omega or cylinder shape.

When the tunneling layer 42 is formed of alumina (Al$_2$O$_3$) by the aforementioned atomic layer deposition method, TMA and H$_2$O are used as a precursor of aluminum (Al) and oxygen (O) consisting of alumina.

After forming the tunneling layer 42 to cover the semiconductor nanowire 41, a charge trapping layer 43 is formed to cover the tunneling layer 42 as illustrated in FIG. 7d. The process of forming the charge trapping layer 43 is same as a process of forming metal nanoparticles on the surface of the semiconductor nanowire 41 coated with the tunneling layer 42.

In the process of forming the charge trapping layer 43 by forming the metal nanoparticles on the surface of the tunneling layer 42, a surface of the tunneling layer 42 is coated with a metal nanofilm by a thermal deposition method. Then, the metal nanofilm is heated using a rapid thermal annealer (RTA) to prepare metal nanoparticles. The charge trapping layer 43 for trapping charge carriers is formed of the prepared metal nanoparticles.

A thickness of the metal nanofilm formed on the surface of the tunneling layer 42 by a thermal deposition method is preferably about 2 to 10 nm, and the metal nanofilm having such a thickness is heated at a temperature of 250 to 1100° C. for 5 to 30 seconds to form the metal nanoparticles. In this state, the semiconductor nanowire 41 having the tunneling layer 42 and the charge trapping layer 43 deposited on the outer surface thereof can be formed in the shape of a cylinder. As described above, FIG. 8a shows a photograph of the nanowire, on which the metal nanoparticles of the charge trapping layer 43 are formed, taken by a scanning electron microscope.

After forming the charge trapping layer 43 consisting of the metal nanoparticles to cover the tunneling layer 42, an insulating layer 44 is formed to cover the charge trapping layer 43 as illustrated in FIG. 7e.

The insulating layer 44 is formed of any one of Al$_2$O$_3$, HfO$_2$, SiO$_2$ and an organic insulating material by an atomic layer deposition method, a CVD method or a sputtering method. In such a state, the semiconductor nanowire 41 having the tunneling layer 42, the charge trapping layer 43 and the insulating layer 44 deposited on the outer surface thereof is formed in the shape of a cylinder. When the insulating layer 44 is formed of alumina (Al$_2$O$_3$) by the aforementioned atomic layer deposition method, TMA and H$_2$O are used as a precursor of aluminum (Al) and oxygen (O) consisting of alumina.

In the process of forming the insulating layer 44 by depositing the alumina, a coating process is performed at 150 to 300° C. during 50 to 400 cycles, and alumina is uniformly deposited on the charge trapping layer 43 to have a thickness of about 10 to 60 nm by a magnetic control mechanism of an atomic layer deposition (ALD) method.

Thereafter, as illustrated in FIG. 7f, a second photoresist 52 is applied to the silicon substrate 10 on which the semiconductor nanowire composite 40 and the source and drain electrodes 31 and 33 are formed, and a second space portion (not shown), in which a gate electrode 35 to be described later is formed, is formed between the source and drain electrodes 31 and 33 by a photolithography method.

Then, a metal layer is laminated in the second space portion and on the second photoresist 52, and the second photoresist 52 is removed, whereby the gate electrode 35 is formed between the source and drain electrodes 31 and 33, as illustrated in FIG. 7g. The metal layer of the gate electrode 35 may be formed by laminating titanium (Ti) and gold (Au) sequentially.

FIG. 8b is a planar photograph illustrating the nonvolatile memory electronic device including nanowire channel and nanoparticles-floating gate nodes of the present invention manufactured according to the foregoing process. As illustrated in FIG. 8b, the nanowire 41 is formed between the source and drain electrodes 31 and 33, and the gate electrode 35 is formed between the source and drain electrodes 31 and 33. The tunneling layer 42, the charge trapping layer 43 of metal nanoparticles, and the insulating layer 44 are sequentially deposited on the surface of the nanowire 41.

Then, an electrical property of the nonvolatile memory electronic device including nanowire channel and nanoparticles-floating gate nodes fabricated by the processes of FIGS. 7a to 7g will be described referring to FIG. 9 of the accompanying drawings. As illustrated in FIG. 9, it can be confirmed that charge carriers flowing through the nanowire are tunneled and trapped in the charge trapping layer when a positive voltage is applied to a gate electrode, whereas charge carriers are detrapped from the charge trapping layer into the nanowire again when a negative voltage is applied to the gate electrode.

Furthermore, it can be observed that as the voltage applied to the gate electrode is gradually increased, a variation width of the threshold voltage shift is further increased since the number of charge carriers trapped in the charge trapping layer is relatively increased.

Third Embodiment

Hereinafter, a fabrication process of a nonvolatile memory electronic device including nanowire channel and nanoparticles-floating gate nodes according to a third embodiment of the present invention will be described referring to FIGS. 10a to 10g of the accompanying drawings.

There are two methods for manufacturing a nanowire. The first one is, according to any one of existing methods, to grow semiconductor nanowires on a substrate, which is preferably made of a Si or $Al_2O_3$ material. According to another method for manufacturing the nanowire, a semiconductor substrate is patterned by a photolithography method or an electron beam lithography method, and then the patterned semiconductor substrate is etched to have a predetermined thickness and width through an etching method, thereby manufacturing a nanowire.

As described above, after growing a semiconductor nanowire on the substrate, a tunneling layer 42 is deposited on a surface of the grown semiconductor nanowire using any one of $Al_2O_3$, $HfO_2$, $SiO_2$ and an organic insulating material by an atomic layer deposition method, a CVD method, or a sputtering method.

After manufacturing the nanowire by etching the semiconductor substrate as described above, the semiconductor nanowire is arranged on the substrate by transferring the semiconductor nanowire onto a semiconductor substrate, a glass substrate, or a plastic substrate using a transfer. Thereafter, the tunneling layer 42 of any one of $Al_2O_3$, $HfO_2$, $SiO_2$ and an organic insulating material is deposited on a surface of the nanowire by an atomic layer deposition method, a CVD method, or a sputtering method.

The tunneling layer 42 is formed of any one material of alumina ($Al_2O_3$), $HfO_2$, $SiO_2$ and an organic insulating material by an atomic layer deposition method, a CVD method or a sputtering method. In this state, the semiconductor nanowire 41, having the tunneling layer 42 deposited on an outer surface thereof, can be formed in the shape of a cylinder.

When the tunneling layer 42 is formed of alumina ($Al_2O_3$) by the aforementioned atomic layer deposition method, TMA and $H_2O$ are used as a precursor of aluminum (Al) and oxygen (O) consisting of alumina.

In the process of forming the tunneling layer 42 by depositing the alumina, a coating process is performed at 150 to 300° C. during 25 to 200 cycles, and alumina is uniformly deposited on the semiconductor nanowire 41 to have a thickness of about 5 to 30 nm by a magnetic control mechanism of an ALD method.

After depositing the tunneling layer 42 on a surface of the semiconductor nanowire 41 by the aforementioned process, a process of adsorbing nanoparticles of a charge trapping layer 43 on the tunneling layer 42, with which the surface of the semiconductor nanowire 41 is coated, is performed.

The process of adsorbing the nanoparticles on the semiconductor nanowire coated with tunneling layer can be performed by the following three methods. The first method will be described referring to FIG. 10a. After dipping a substrate 40a to which a grown semiconductor nanowire 41 is attached into an aqueous dispersion, the semiconductor nanowire 41 is dispersed using ultrasonic waves. At this time, the tunneling layer 42 is deposited on a surface of the semiconductor nanowire 41 as described above.

Then, after dipping nanoparticles to be adsorbed on a surface of the tunneling layer 42 into an aqueous dispersion, the nanoparticles are dispersed using ultrasonic waves. The nanoparticles are used for the charge trapping layer 43. After mixing the aqueous nanowire coated with tunneling layer dispersion with the aqueous nanoparticle dispersion in an ultrasonic water bath, the nanoparticles are adsorbed on the nanowire coated with tunneling layer using ultrasonic waves. The aqueous dispersion for dispersing the nanowire and the nanoparticles preferably consist of any one of distilled water, ethanol, methanol and acetone.

FIG. 11 shows a TEM image of a heterojunction nanomaterial in which a Si nanowire coated with tunneling layer and Au nanoparticles are bonded to each other. As a more specific embodiment, the Au nanoparticles are formed on the Si nanowire coated with tunneling layer as described above by mixing a Si nanowire coated with tunneling layer with 0.01 M of a $HAuCl_4$ solution, applying ultrasonic waves to the mixture and stabilizing the mixture, and heat-treating the mixture. A state in which the Au nanoparticles are adsorbed on the Si nanowire coated with tunneling layer can be confirmed from FIG. 11. Also, it can be confirmed from FIG. 11 that the Au nanoparticles have a generally uniform particle diameter of about 8 to 15 nm.

According to a second method, it is possible to adsorb the nanoparticles on the semiconductor nanowire coated with tunneling layer by a simply method of mixing a semiconductor nanowire coated with tunneling layer with a solution containing nanoparticles. FIG. 12 shows a TEM photograph of a heterojunction nanomaterial in which the ZnO nanowire coated with tunneling layer and the CdTe nanoparticles are bonded to each other by mixing a ZnO nanowire coated with tunneling layer with a solution containing CdTe nanoparticles. It can be seen from FIG. 13 that CdTe nanoparticles are adsorbed on a surface of a ZnO nanowire coated with tunneling layer relatively uniformly.

According to a third method, Si nanoparticles are deposited on the nanowire coated with tunneling layer by etching the poly-Si layer after forming a thin poly-Si layer on tunneling layer coated nanowire grown by a thermal evaporation method, a CVD method, or a sputtering method. FIG. 16 shows an image of poly-Si nanoparticles prepared by etching a poly-Si layer on a ZnO nanowire coated with tunneling layer by a low pressure chemical vapor deposition method.

After adsorbing nanoparticles on the surface of the tunneling layer 42 coated nanowires fabricated by a process described above, nanowires are separated from the substrate. Then, as illustrated in FIG. 10b, the semiconductor nanowire 41, in which the tunneling layer 42 and the charge trapping layer 43 consisting of nanoparticles are sequentially formed, can be obtained. The semiconductor nanowire illustrated in FIG. 10b is one of numerous separated nanowires.

Thereafter, an insulating layer 44 is formed to cover the charge trapping layer 43 as illustrated in FIG. 10c. The insulating layer 44 is formed of any one of alumina ($Al_2O_3$), $HfO_2$, $SiO_2$ and an organic insulating material by an atomic layer deposition method, a CVD method or a sputtering method. In this state, the semiconductor nanowire 41 having the tunneling layer 42, the charge trapping layer 43 and the insulating layer 44 deposited on the outer surface thereof can be formed in the shape of a cylinder.

When the insulating layer 44 is formed of alumina ($Al_2O_3$) by the aforementioned atomic layer deposition method, TMA and $H_2O$ are used as a precursor of aluminum (Al) and oxygen (O) consisting of alumina. In the process of forming the insulating layer 44 by depositing the alumina, a coating process is performed at 150 to 300° C. during 50 to 400 cycles, and alumina is uniformly deposited on the charge trapping layer 43 to have a thickness of about 10 to 60 nm by a magnetic control mechanism of an ALD method.

After sequentially forming the tunneling layer 42, the charge trapping layer 43 and the insulating layer 44 on the surface of the semiconductor nanowire 41 by the aforementioned processes, semiconductor nanowire composite is dispersed on the hexamethyldisilazane (HMDS) film 21, deposited on a silicon, semiconductor, glass, or plastic substrate 10 not only to increase adhesive force between the photoresist layer and substrate but also to serve as a sacrificial layer for the semiconductor nanowire composite to be floated from the substrate, then the first photoresist layer 53 is spin-coated onto the semiconductor nanowire composite-dispersed HMDS film. Resist patterns in the range from several µm to several tens of nm for the formation of electrodes are made after exposure and development processes, as illustrated in FIG. 10d. That is, a first space portion (not shown), in which source and drain electrodes to be described later are formed, is formed by a photolithography method. In the meantime, an insulating layer 20 may be additionally formed between the substrate 10 and the HMDS film 21.

Here, the semiconductor nanowire composite is formed on the HMDS film 21, and if necessary, a carbon nanotube or an organic tube as well as the semiconductor nanowire may be formed on the HMDS film 21. The semiconductor nanowire 41 is preferably formed of any one component selected from Si, Ge, GaN, BN, InP, GaAs, GaP, $Si_3N_4$, $SiO_2$, SiC, ZnO and $Ga_2O_3$. The semiconductor nanowire 41 is synthesized by a thermal CVD method or formed by etching a semiconductor substrate.

Subsequently, after laminating a metal layer in the first space portion and on the first photoresist 53, the first photoresist 53 and the HMDS film 21 are removed. Accordingly, a source electrode 31 and a drain electrode 33 are formed on both ends of the semiconductor nanowire 41 having the tunneling layer 42, the charge trapping layer 43 and the insulating layer 44 sequentially formed on the surface thereof as illustrated in FIG. 10e. The metal layer of the source and drain electrodes 31 and 33 is formed by laminating titanium (Ti) and gold (Au) sequentially.

As described above, after forming the source electrode 31 and the drain electrode 33 on both the ends of the semiconductor nanowire 41, as illustrated in FIG. 10f, a second photoresist 54 is applied to the substrate 10 on which the semiconductor nanowire composite 40 and the source and drain electrodes 31 and 33 are formed, and a second space portion (not shown), in which a gate electrode 35 to be described later is formed, is formed between the source and drain electrodes 31 and 33 by a photolithography method.

Then, a metal layer is laminated in the second space portion and on the second photoresist 54, and the second photoresist 54 is removed, whereby the gate electrode 35 is formed between the source and drain electrodes 31 and 33, as illustrated in FIG. 10g. The metal layer of the gate electrode 35 is formed by laminating titanium (Ti) and gold (Au) sequentially.

Next, an electrical property of a nonvolatile memory electronic device including nanowire channel and nanoparticles-floating gate nodes fabricated by the processes of FIGS. 10a to 10g will be described referring to FIG. 14 of the accompanying drawings.

The upper graph of FIG. 14 shows a change of a threshold voltage shift according to gate voltage sweep range, indicating memory effect of the device, and a lower graph of FIG. 14 shows that the magnitude of current varies as the gate voltage changes.

According to a nonvolatile memory electronic device including nanowire channel and nanoparticles-floating gate nodes and a method for fabricating the same according to the present invention having the foregoing configurations and preferred embodiments, a memory device including nanowire channel and nanoparticles-floating gate nodes, which comprises a semiconductor nanowire used as a charge transport channel and nanoparticles used as a charge trapping layer, is configured by allowing the nanoparticles to be adsorbed on a tunneling layer deposited on a surface of the semiconductor nanowire, whereby a degree of integration is improved by reducing a channel used in transporting charge carriers using the nanowire, and a property of the channels is improved using the nanowire with excellent charge mobility. Furthermore, the device can be operated even at a low gate operating voltage by using nanoparticles as a charge trapping layer, thereby reducing thickness of a tunneling layer and an insulating layer and thus improving a degree of integration of the device.

In addition, there is provided a memory electronic device including nanowire channel and nanoparticles-floating gate nodes and a method for fabricating the same, wherein a gate structure used in a nonvolatile memory device is changed from an existing one-dimensional planar structure shape to a gate structure shape, such as top, omega and cylinder shapes, so that on/off property, subthreshold swing effect and mobility of the device are maximized according to the change of the gate structure, thereby providing a faster operating speed and a lower operating voltage. In addition, the method is simpler and less expensive than an existing top-down type fabrication process by bottom-up type fabrication process.

Further, there is provided a method for obtaining various nanowires using a thermal growing method and an etching method. Nanoparticles are adsorbed on a nanowire by a rapid thermal annealing method, a mixing method of nanowire and nanoparticles into a solution, an ultrasonic wave treating method, a heat treating method after nanoparticle ion implantation, a method of applying voltage to nanowire to adsorb nanoparticles thereon, a method of using a double nozzle of an electro-sprayer, and a chemical etching method.

What is claimed is:

1. A method for fabricating a nonvolatile electronic memory device including nanowire channel and nanoparticle-floating gate nodes, the method comprising:
preparing a semiconductor nanowire composite;
forming a gate electrode in a central part of a nanowire on the semiconductor nanowire composite by photolithography or electron beam lithography;
applying a sample of the nanowire composite/gate electrode formed nanowire composite to any one of $SiO_2$ capped silicon, semiconductor, glass or plastic substrate; and
forming source and drain electrodes on both ends of the nanowire on the $SiO_2$ capped silicon semiconductor, glass or plastic substrate by photolithography or electron beam lithography, wherein the preparing of a semiconductor nanowire composite includes:
coating a semiconductor nanowire with a tunneling layer by any one of atomic layer deposition, sputtering or chemical vapor deposition;
adsorbing nanoparticles on the tunneling layer, the nanoparticles being formed into a charge trapping layer; and
coating the nanoparticles with an insulating layer by any one of atomic layer deposition, sputtering or chemical vapor deposition.

2. A method for fabricating a nonvolatile electronic memory device including nanowire channel and nanoparticle-floating gate nodes, comprising the steps of:
applying a hexamethyldisilazane (HMDS) layer to any of a semiconductor, glass or plastic substrate and forming a semiconductor nanowire on the HMDS layer;
forming source and drain electrodes on both ends of the semiconductor nanowire on the HDMS layer having the semiconductor nanowire formed thereon;
forming a tunneling layer to cover the semiconductor nanowire by any of atomic layer deposition, sputtering or chemical vapor deposition;
forming a charge trapping layer to cover the tunneling layer by forming nanoparticles on a surface of the tunneling layer;
forming an insulating layer to cover the charge trapping layer by any of atomic layer deposition, sputtering or chemical vapor deposition; and
forming a gate electrode on the insulating layer between the source and drain electrodes.

3. The method as claimed in claim 2, wherein the step of forming a semiconductor nanowire includes the step of growing nanowire on a substrate by thermal chemical vapor deposition.

4. The method as claimed in claim 2, wherein the step of forming a semiconductor nanowire includes the step of etching a semiconductor substrate by etching.

5. The method as claimed in claim 2, wherein the step of forming a charge trapping layer includes the steps of coating a surface of the tunneling layer with a metal nanofilm by thermal evaporation, and forming metal nanoparticles by heating the metal nanofilm using a rapid thermal annealer (RTA).

6. The method as claimed in claim 5, wherein the step of coating a surface of the tunneling layer with a metal nanofilm is performed with a thickness between 2 to 10 nm.

7. The method as claimed in claim 5, wherein the step of forming metal nanoparticles is performed by heating the metal nanofilm at a temperature of 250 to 1100° C. for 5 to 30 seconds.

8. A method for fabricating a nonvolatile electronic memory device including nanowire channel and nanoparticle-floating gate nodes, comprising the steps of:
coating a surface of a semiconductor nanowire grown on a substrate with a tunneling layer by any of atomic layer deposition, sputtering or chemical vapor deposition;
adsorbing nanoparticles on the tunneling layer formed on the surface of the semiconductor nanowire, the nanoparticles being formed into a charge trapping layer;
coating the nanoparticles formed into the charge trapping layer with an insulating layer by any of atomic layer deposition, sputtering or chemical vapor deposition;
applying an HMDS layer to any of a semiconductor, glass or plastic substrate, and forming the semiconductor nanowire having the tunneling layer, the charge trapping layer and the insulating layer sequentially formed on the surface thereof on the HMDS layer;
forming source and drain electrodes on both ends of the semiconductor nanowire on the HMDS layer having the semiconductor nanowire formed thereon; and
forming a gate electrode on the insulating layer between the source and drain electrodes.

9. The method as claimed in claim 8, wherein the step of growing a semiconductor nanowire is performed by growing a semiconductor nanowire on a substrate formed of a Si or $Al_2O_3$ material.

10. The method as claimed in claim 8, wherein the step of adsorbing nanoparticle includes the steps of:
dipping the substrate to which the grown nanowire is attached into an aqueous dispersion, and dispersing the nanowire using ultrasonic waves;
mixing the aqueous nanowire dispersion with an aqueous dispersion containing nanoparticles; and
adsorbing the nanoparticles on the nanowire using ultrasonic waves.

11. The method as claimed in claim 10, wherein the aqueous dispersion includes any selected from distilled water, ethanol, methanol and/or acetone.

12. The method as claimed in claim 8, wherein the step of adsorbing nanoparticles is performed by mixing the semiconductor nanowire with a solution containing nanoparticles.

13. The method as claimed in claim 8, wherein the step of depositing nanoparticle is performed by depositing a poly-Si layer on the semiconductor nanowire by a low pressure chemical vapor deposition method and then etching the poly-Si layer by wet etching to form Si nanoparticles.

14. The method as claimed in claim 2, wherein the step of forming source and drain electrodes includes the steps of:
applying a first photoresist and forming a plurality of first space portions by photolithography; and
laminating a metal layer in the first space portions and on the first photoresist and removing the first photoresist and the HMDS layer to form the source and drain electrodes on both ends of the semiconductor nanowire.

15. The method as claimed in claim 2, wherein the steps of forming a tunneling layer and an insulating layer are performed using any selected from $Al_2O_3$, $HfO_2$ and/or $SiO_2$ by atomic layer deposition.

16. The method as claimed in claim 15, wherein TMA and $H_2O$ are used as a precursor when the tunneling layer and the insulating layer are formed of $Al_2O_3$.

17. The method as claimed in claim 15, wherein the tunneling layer is formed to have a thickness between 5 nm and 30 nm.

18. The method as claimed in claim 15, wherein the insulating layer is formed to have a thickness between 10 nm and 60 nm.

19. The method as claimed in claim 2, wherein the step of forming a semiconductor nanowire includes the step of forming a carbon nanotube (CNT) or an organic tube as well as the semiconductor nanowire.

20. The method as claimed in claim 2, wherein the step of forming a gate electrode includes the steps of:
applying a second photoresist to a substrate having the insulating layer and the source and drain electrodes formed thereon, and forming a second space portion between the source and drain electrodes by photolithography; and
laminating a metal layer in the second space portion and on the second photoresist and removing the second photoresist to form a gate electrode.

21. The method as claimed in claim 8, wherein the step of forming source and drain electrodes includes the steps of:
applying a first photoresist and forming a plurality of first space portions by photolithography; and
laminating a metal layer in the first space portions and on the first photoresist and removing the first photoresist and the HMDS layer to form the source and drain electrodes on both ends of the semiconductor nanowire.

22. The method as claimed in claim 8, wherein the steps of forming a tunneling layer and an insulating layer are performed using any selected from $Al_2O_3$, $HfO_2$ and/or $SiO_2$ by atomic layer deposition.

23. The method as claimed in claim 22, wherein TMA and $H_2O$ are used as a precursor when the tunneling layer and the insulating layer are formed of $Al_2O_3$.

24. The method as claimed in claim 22, wherein the tunneling layer is formed to have a thickness between 5 nm and 30 nm.

25. The method as claimed in claim 22, wherein the insulating layer is formed to have a thickness between 10 nm and 60 nm.

26. The method as claimed in claim 8, wherein the step of forming a semiconductor nanowire includes the step of forming a carbon nanotube (CNT) or an organic tube as well as the semiconductor nanowire.

27. The method as claimed in claim 8, wherein the step of forming a gate electrode includes the steps of:
applying a second photoresist to a substrate having the insulating layer and the source and drain electrodes formed thereon, and forming a second space portion between the source and drain electrodes by photolithography; and
laminating a metal layer in the second space portion and on the second photoresist and removing the second photoresist to form a gate electrode.

* * * * *